US012604480B2

(12) United States Patent
Lin et al.

(10) Patent No.: US 12,604,480 B2
(45) Date of Patent: Apr. 14, 2026

(54) FERROELECTRIC MEMORY DEVICE AND METHOD OF FORMING THE SAME

(71) Applicant: Taiwan Semiconductor Manufacturing Co., Ltd., Hsinchu (TW)

(72) Inventors: Meng-Han Lin, Hsinchu (TW); Bo-Feng Young, Taipei (TW); Sai-Hooi Yeong, Zhubei City (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 630 days.

(21) Appl. No.: 18/152,597

(22) Filed: Jan. 10, 2023

(65) Prior Publication Data

US 2024/0015982 A1     Jan. 11, 2024

Related U.S. Application Data

(60) Provisional application No. 63/377,825, filed on Sep. 30, 2022, provisional application No. 63/367,826, filed on Jul. 7, 2022.

(51) Int. Cl.

| | |
|---|---|
| *H10B 51/30* | (2023.01) |
| *H10D 30/01* | (2025.01) |
| *H10D 30/67* | (2025.01) |
| *H10D 30/69* | (2025.01) |
| *H10D 62/13* | (2025.01) |

(52) U.S. Cl.
CPC ........... *H10B 51/30* (2023.02); *H10D 30/031* (2025.01); *H10D 30/0415* (2025.01); *H10D 30/6755* (2025.01); *H10D 30/6757* (2025.01); *H10D 30/701* (2025.01); *H10D 62/151* (2025.01)

(58) Field of Classification Search
CPC ........... H10D 30/6755; H10D 30/6766; H10D 30/6732; H10D 30/701; H10D 30/6757; H10D 30/6737
See application file for complete search history.

(56) References Cited

U.S. PATENT DOCUMENTS

| | | |
|---|---|---|
| 2008/0246088 A1 | 10/2008 | Schuele et al. |
| 2012/0001178 A1 | 1/2012 | Miyairi et al. |
| 2012/0326126 A1 | 12/2012 | Chen et al. |

(Continued)

FOREIGN PATENT DOCUMENTS

| | | |
|---|---|---|
| TW | 201140847 A | 11/2011 |
| TW | 202201783 A | 1/2022 |
| TW | 202215546 A | 4/2022 |

*Primary Examiner* — Vincent Wall
(74) *Attorney, Agent, or Firm* — Slater Matsil, LLP

(57) ABSTRACT

A device includes a memory layer over a substrate; a first source/drain structure and a second source/drain structure on the memory layer, wherein the first source/drain structure and the second source drain structure each include a first source/drain layer on the memory layer; a second source/drain layer on the first source/drain layer, wherein the second source/drain layer is different from the first source/drain layer; and a metal layer on the second source/drain layer; and a channel region extending on the memory layer from the first source/drain layer of the first source/drain structure to the first source/drain layer of the second source/drain structure.

20 Claims, 11 Drawing Sheets

200

(56) References Cited

U.S. PATENT DOCUMENTS

| | | | | |
|---|---|---|---|---|
| 2015/0221679 A1* | 8/2015 | Yamazaki | ............ | H10D 62/875 |
| | | | | 257/43 |
| 2020/0075778 A1 | 3/2020 | Shih et al. | | |
| 2020/0083380 A1 | 3/2020 | Lai et al. | | |
| 2020/0091274 A1* | 3/2020 | Sharma | ................ | H10D 64/689 |
| 2020/0176457 A1* | 6/2020 | Sharma | ................ | H10D 64/033 |
| 2021/0399136 A1* | 12/2021 | Vellianitis | .......... | H10D 30/6739 |
| 2022/0093616 A1 | 3/2022 | Wei et al. | | |
| 2022/0254897 A1* | 8/2022 | Tsai | ................... | H10D 30/6757 |

* cited by examiner

200

214
212
210
204
202
124

208

200

212
210
204
202
124

208

FERROELECTRIC MEMORY DEVICE AND METHOD OF FORMING THE SAME

PRIORITY CLAIM AND CROSS-REFERENCE

This application claims the benefits of U.S. Provisional Application No. 63/377,825, filed on Sep. 30, 2022, and U.S. Provisional Application No. 63/367,826, filed on Jul. 7, 2022, which applications are hereby incorporated herein by reference in their entirety.

BACKGROUND

Semiconductor memories are used in integrated circuits for electronic applications, including radios, televisions, cell phones, and personal computing devices, as examples. Semiconductor memories include two major categories: volatile memories and non-volatile memories. Volatile memories include Random Access Memory (RAM), which can be further divided into two sub-categories: Static Random Access Memory (SRAM) and Dynamic Random Access Memory (DRAM). Both SRAM and DRAM are considered volatile because they lose their stored information when they are not powered.

On the other hand, non-volatile memories can retain stored information even when unpowered. One type of non-volatile semiconductor memory is Ferroelectric Random Access Memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
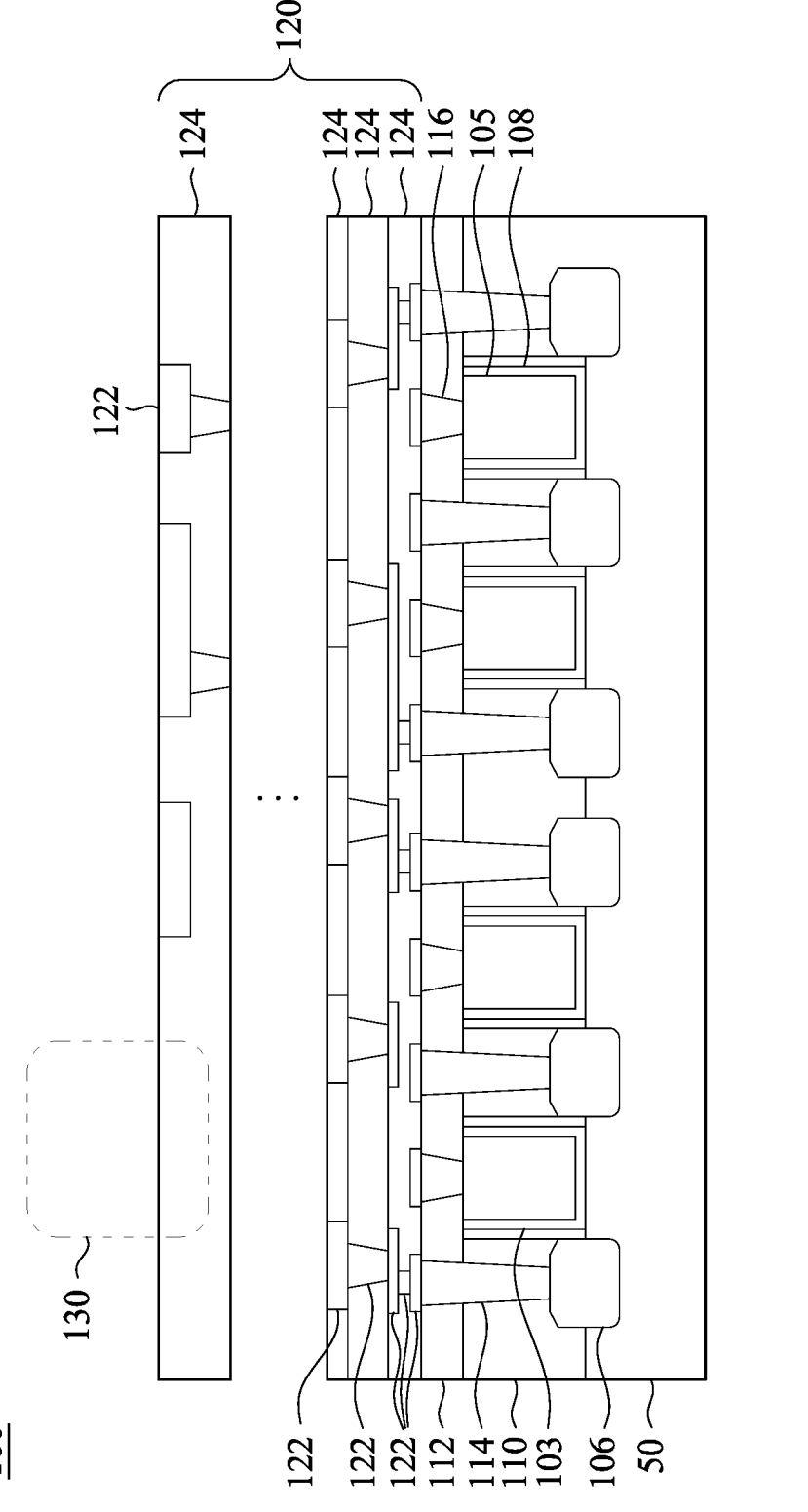
FIG. 1 illustrates a cross-sectional view of a semiconductor structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments described herein provide Ferroelectric Thin Film Transistor (FeTFT) memory cells and corresponding methods of formation. In some embodiments, the source/drain structures of the TFT within a memory cell is formed by depositing a first source/drain layer (e.g., an oxide semiconductor layer or the like) and then depositing a second source/drain layer on the first source/drain layer. In some cases, seams or other defects may form in the first source/drain layer due to, for example, the topography of the structure. Depositing a first source/drain layer can allow the second source/drain layer to be deposited on the first source/drain layer with reduced risk of defect formation. The second source/drain layer also may cover the defects in the first source/drain layer such that the second source/drain layer provides a less resistive interface than the first source/drain layer. In some embodiments, the first source/drain layer may be etched prior to deposition of the second source/drain layer, which can reduce the size of defects in the first source/drain layer. Depositing both a first source/drain layer and a second source/drain layer in this manner can improve device performance, improve device uniformity, and reduce the risk or severity of problems related to the formation of defects in the source/drain structures.

FIG. 1 illustrates a cross-sectional view of a semiconductor structure 100 comprising a substrate 50 in which various circuits may be formed, in accordance with some embodiments. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 1 further illustrates circuits that may be formed over the substrate 50. The circuits may include active devices (e.g., transistors) at a top surface of the substrate 50. In some embodiments, the transistors may include gate dielectric layers 103 over top surfaces of the substrate 50 and gate electrodes 105 over the gate dielectric layers 103. Source/drain regions 106 are disposed in the substrate 50 on opposite sides of the gate dielectric layers 103 and the gate electrodes 105. "Source/drain," "source/drain region(s)," "source/drain structure(s)," or similar phrases herein may refer to a source or a drain, individually or collectively, which may depend on the context. Gate spacers 108 may be formed along sidewalls of the gate dielectric layers 103 and separate the source/drain regions 106 from the gate electrodes 105 by appropriate lateral distances. In some embodiments, the transistors may be, for example, planar Field-Effect Transistors (FETs), Fin Field-Effect Transistors (FinFETs), Nanostructure Field-Effect Transistors (NSFETs, nanosheet FETs, etc.), or the like.

In some embodiments, a first ILD 110 surrounds and isolates the source/drain regions 106, the gate dielectric layers 103, and the gate electrodes 105. A second ILD 112 may be formed over the first ILD 110, in some embodiments. Source/drain contacts 114 extend through the second ILD 112 and/or the first ILD 110 and are electrically coupled to the source/drain regions 106. Gate contacts 116 extend through the second ILD 112 and/or the first ILD 110 and are electrically coupled to the gate electrodes 105.

A multilevel interconnect structure 120 may be formed over the second ILD 112, the source/drain contacts 114, and the gate contacts 116, in accordance with some embodiments. The interconnect structure 120 may comprise one or more stacked dielectric layers 124 and conductive features 122 formed in the one or more dielectric layers 124. One or more of the dielectric layers 124 may be Inter-Metal Dielectric (IMD) layers, in some cases. The dielectric layers 124 may comprise one or more layers of one or more suitable dielectric materials, such as silicon oxide, phosphosilicate glass (PSG), borosilicate glass (BSG), boron-doped phosphosilicate glass (BPSG), undoped silicate glass (USG), a low dielectric constant (low-k) material, fluorosilicate glass (FSG), silicon oxycarbide, carbon-doped oxide (CDO), flowable oxide, a polymer, the like, or a combination thereof. The dielectric layers 124 may be deposited using any suitable technique, such as Chemical Vapor Deposition (CVD), Physical Vapor Deposition (PVD), Atomic Layer Deposition (ALD), Plasma-Enhanced ALD (PEALD), Plasma-Enhanced CVD (PECVD), Flowable CVD (FCVD), spin-on, the like, or a combination thereof. Other materials or formation techniques are possible.

The conductive features 122 may comprise, for example, conductive lines, conductive vias, metallization patterns, redistribution layers, or the like. The interconnect structure 120 shown in FIG. 1 is an example, and it should be appreciated that the interconnect structure 120 may include any number of dielectric layers 124 having conductive features 122 disposed therein. In some embodiments, the interconnect structure 120 may be formed as part of a Back End of Line (BEOL) process or a Middle End of Line (MEOL) process. The conductive features 122 may be formed using a suitable technique such as damascene, dual damascene, or another technique. In some embodiments, the conductive features 122 may comprise a liner (not shown), such as a diffusion barrier layer, an adhesion layer, or the like, and a conductive material. The liner may include titanium, titanium nitride, tantalum, tantalum nitride, the like, or a combination thereof. The conductive material may include copper, a copper alloy, silver, gold, tungsten, cobalt, aluminum, nickel, ruthenium, the like, or a combination thereof. The material(s) of the conductive features 122 may be deposited using a suitable technique such as ALD, CVD, PVD, plating, electro-less plating, the like, or a combination thereof. Other materials or formation techniques are possible.

The interconnect structure 120 may be electrically connected to the gate contacts 116 and the source/drain contacts 114 to form functional circuits. In some embodiments, the functional circuits formed by the interconnect structure 120 may comprise logic circuits, memory circuits, sense amplifiers, controllers, input/output circuits, image sensor circuits, the like, or combinations thereof. Although FIG. 1 illustrates transistors formed over the substrate 50, other active devices (e.g., diodes or the like) and/or passive devices (e.g., capacitors, resistors, or the like) may also be formed as part of the functional circuits. For example, these active devices and/or passive devices may be electrically connected to the interconnect structure 120.

FIG. 1 also illustrates an example region 130 in which a memory cell may be subsequently formed, in accordance with some embodiments. The memory cell formed in the region 130 may be similar to the memory cell 200 described below in FIG. 13, or may be similar to other embodiments of memory cells described herein. For example, the memory cell formed in the region 130 may be a Ferroelectric Thin-Film Transistor (FeTFT) memory cell formed using techniques described herein. In some embodiments, the memory cell may be formed on a top dielectric layer 124 of the interconnect structure 120, as shown with region 130 in FIG. 1. In other embodiments, the memory cell of region 130 may be formed over a top conductive feature 122 of the interconnect structure 120. The memory cell of region 130 may be electrically connected to an underlying conductive feature 122, in some embodiments. In other embodiments, the region 130 may be within the interconnect structure 120. In this manner, the memory cell may be formed on a dielectric layer 124 within the interconnect structure 120 or formed over a conductive feature 122 within the interconnect structure 120. In such embodiments, the memory cell may be considered part of the interconnect structure 120, in some cases. Additional dielectric layers 124 and/or conductive features 122 may be formed over the memory cell, in some embodiments.

In some embodiments, the memory cell formed in region 130 may be a single cell in a larger memory array (not shown). The memory array may comprise a plurality of memory cells arranged in a suitable configuration, such as in a grid-like arrangement of rows and columns. Accordingly, the memory cell formed in region 130 may be electrically coupled to one or more other memory cells, which may be similar. For example, the memory cells of the memory array may be electrically coupled by word lines, bit line, and/or source lines that allow individual memory cells to be selected for read or write operations. In some cases, the interconnect structure 120 may provide electrical interconnections between the various memory cells of the memory array, or may provide electrical connection between memory cells of the memory array and underlying functional circuits.

FIGS. 2 through 13 illustrate cross-sectional views of intermediate steps in the formation of a memory cell 200 (see FIG. 13), in accordance with some embodiments. The memory cell 200 may be, for example, a Ferroelectric Thin-Film Transistor (FeTFT) memory cell, and may be a single memory cell of a larger memory array. FIGS. 2-13 show a magnified view of the region 130 of FIG. 1 in which the memory cell 200 may be formed. For example, the dielectric layer 124 shown in FIGS. 2-13 may be a top dielectric layer 124 of an interconnect structure 120, similar to FIG. 1. Features such as the substrate 50 and other dielectric layers 124 or conductive features 122 of the interconnect structure 120 are not shown for the purposes of simplicity and clarity.

Figures 2, 3, 4:
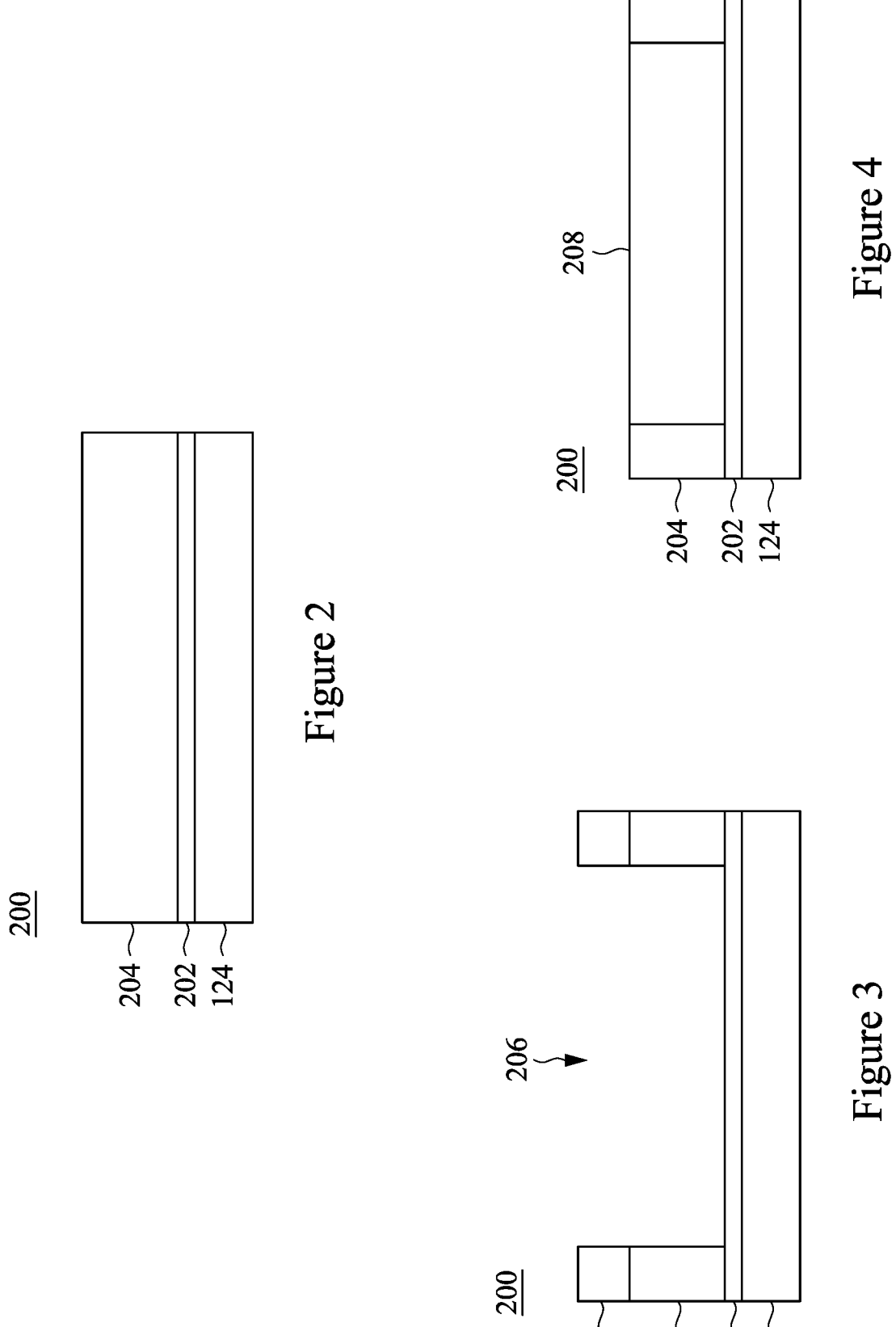
FIGS. 2, 3, 4, 5, 6, 7, 8, 9, 10, 11, 12, and 13 illustrate cross-sectional views of intermediate steps in the formation of a memory cell, in accordance with some embodiments.

In FIG. 2, an etch stop layer 202 and an insulating layer 204 are formed over the dielectric layer 124, in accordance with some embodiments. The etch stop layer 202 is an optional layer, and may comprise one or more layers of dielectric material that have a lower etch rate than the underlying dielectric layer 124 and/or the overlying insulating layer 204, in some cases. In some embodiments, the etch stop layer 202 may comprise one or more layers of material such as silicon nitride, silicon oxide, silicon oxynitride, silicon carbide, silicon carbonitride, silicon oxycarbide, the like, or a combination thereof. The etch stop layer 202 may be formed using a suitable technique, such as CVD, PVD, ALD, or the like. Other materials or formation techniques are possible. The insulating layer 204 may be formed of material(s) similar to those described previously for the dielectric layers 124, and may be formed using similar techniques. The insulating layer 204 may be the same material as the underlying dielectric layer 124, or may be a different material. In other embodiments, the insulating layer 204 may be considered to be an IMD layer, or may be considered to be a dielectric layer of the interconnect structure 120.

In FIG. 3, an opening 206 is formed in the insulating layer 204, in accordance with some embodiments. A back-gate 208 (see FIG. 4) is subsequently formed in the opening 206. The opening 206 may be formed, for example, by first forming a photoresist 205 over the insulating layer 204 and then patterning the photoresist 205. The photoresist 205 can be formed, for example, using a spin-on technique. The photoresist 205 may be patterned using acceptable photolithography techniques. The exposed portions of the insulating layer 204 may then be etched using the patterned photoresist 205 as an etch mask. The etching may be performed using any acceptable etch process, such as a wet etching process, a dry etching process, a reactive ion etch (RIE), neutral beam etch (NBE), the like, or a combination thereof. The etching may be anisotropic. The etching may stop on the etch stop layer 202, as shown in FIG. 3. In other embodiments, the etching also removes portions of the etch stop layer 202 to expose the dielectric layer 124. In other embodiments in which a conductive feature 122 is present in the region 130, the etching may expose the conductive feature 122. The photoresist 205 may be subsequently removed using an ashing process or another suitable process.

In FIG. 4, a conductive material is deposited in the opening 206 to form the back-gate 208, an accordance with some embodiments. The back-gate 208 comprises a material suitable for providing a gate electrode of a Thin-Film Transistor (TFT) of the memory cell 200, in some embodiments. The conductive material may include, for example, copper, titanium, titanium nitride, tantalum, tantalum nitride, tungsten, ruthenium, aluminum, the like, or a combination thereof. In some embodiments, the back-gate 208 may include a liner (not shown). In some embodiments, the back-gate 208 may include one or more materials similar to those described previously for the conductive features 122. The conductive material of the back-gate 208 may be deposited using a suitable technique, such as ALD, CVD, PVD, plating, electro-less plating, the like, or a combination thereof. Other materials or formation techniques are possible. In some embodiments, a planarization process (e.g., a Chemical Mechanical Polish (CMP) process or the like) is performed to remove excess portions of conductive material.

In some embodiments, after performing the planarization process, top surfaces of the insulating layer 204 and the back-gate 208 may be substantially level or coplanar, within process variations. In other embodiments, the back-gate 208 may physically and electrically contact an underlying conductive feature 122.

Figures 5, 6:
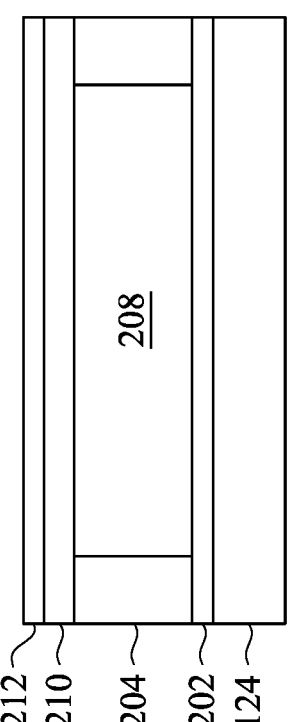

In FIG. 5, a memory layer 210 and a channel layer 212 are deposited over the insulating layer 204 and the back-gate 208, in accordance with some embodiments. The memory layer 210 comprises a material suitable for providing a gate dielectric of a TFT of the memory cell 200, in some embodiments. The memory layer 210 may also comprise a material that is capable of storing a bit, such as a material capable of being switched between two different polarization directions by applying an appropriate voltage differential across the memory layer 210. In some embodiments, the memory layer 210 comprises a high-k dielectric material, such as a hafnium-based dielectric material, or the like. In some embodiments, the memory layer 210 comprises a ferroelectric material, such as hafnium oxide, hafnium zirconium oxide, hafnium silicon oxide, hafnium oxynitride, hafnium aluminum oxide, another hafnium metal oxide, another metal oxide, or the like. In other embodiments, the memory layer 210 may be a multilayer structure comprising a layer of SiN$_x$ between two SiO$_x$ layers (e.g., an ONO structure). In still other embodiments, the memory layer 210 comprises a different ferroelectric material or a different type of memory material. The memory layer 210 may be deposited by CVD, PVD, ALD, PECVD, or the like as a blanket layer. In some embodiments, after the memory layer 210 is deposited, an annealing step may be performed. In some embodiments, the memory layer 210 may be deposited to a thickness that is in the range of about 2 nm to about 20 nm, though other thicknesses are possible.

For embodiments in which the memory layer 210 comprises a ferroelectric material, the memory layer 210 may be polarized in one of two different directions. The polarization direction of the memory layer 210 may be changed (e.g., "programmed") by applying an appropriate voltage differential across the memory layer 210 that generates a correspondingly appropriate electric field within the memory layer 210. For example, in some embodiments, the polarization direction of the memory layer 210 may be changed by applying a voltage differential between the back-gate 208 and the source/drain structures 230 (see FIG. 13) of the TFT of the memory cell 200. The polarization direction may be relatively localized (e.g., generally contained within the boundaries of a memory cell 200), and a continuous region of the memory layer 210 may extend across a plurality of memory cells 200. Depending on the polarization direction of the memory layer 210 within a memory cell 200, the threshold voltage of the Thin-Film Transistor (TFT) of that memory cell 200 varies. For example, when the memory layer 210 within a memory cell 200 has a first electrical polarization direction, the corresponding TFT of the memory cell 200 may have a relatively low threshold voltage, and when the memory layer 210 has a second electrical polarization direction, the corresponding TFT may have a relatively high threshold voltage. In this manner, a binary value (e.g., 0 or 1) corresponding to a polarization direction may be stored, programmed, and accessed.

The channel layer 212 is deposited over the memory layer 210, in accordance with some embodiments. The channel layer 212 comprises a material suitable for providing a channel region of a TFT of the memory cell 200, in some embodiments. For example, in some embodiments, the channel layer 212 is subsequently etched to form a channel region 213 (see FIG. 10). In some embodiments, the channel layer 212 comprises an indium-comprising material, such as $In_xGa_yZn_zMO$, where M may be titanium (Ti), aluminum (Al), tin (Sn), tungsten (W), or the like. The values of x, y, and z may each be any value between 0 and 1. For example, the channel layer 212 may comprise indium gallium zinc oxide, indium titanium oxide, indium tungsten oxide, indium zinc oxide, indium tin oxide, indium oxide, nickel oxide, copper oxide, chromium oxide, cobalt oxide, manganese oxide, the like, or a combination thereof. In this manner, the channel layer 212 may be considered an oxide semiconductor (OS) layer, in some embodiments. In other embodiments, a different semiconductor material than these examples may be used for the channel layer 212. The channel layer 212 may be deposited using a suitable process, such as CVD, PVD, ALD, PECVD, or the like. In some embodiments, the channel layer 212 may be deposited using precursors such as InCA-1, trimethylgallium, diethyl zinc, the like, or a combination thereof. In some embodiments, the channel layer 212 may be deposited using a process temperature in the range of about 0° C. to about 300° C., though other temperatures are possible. Other materials, deposition techniques, or precursors are possible. In some embodiments, the channel layer 212 may be deposited to a thickness that is in the range of about 0.5 nm to about 20 nm, though other thicknesses are possible.

In some embodiments, the concentration of charge carriers (e.g., "Nd") of the channel layer 212 may be in the range of about $1e17$ $cm^{-3}$ to about $5e18$ $cm^{-3}$, though other concentrations are possible. In some embodiments, the concentration of charge carriers may be controlled by controlling the relative proportion of indium in the channel layer 212. For example, increasing the relative proportion of one or more metal elements (e.g., indium) in the channel layer 212 may increase the concentration of charge carriers in the channel layer 212. Other techniques for controlling the concentration of charge carriers are possible. In some cases, forming a channel layer 212 having a relatively low concentration of charge carriers, such as a concentration below about $1e18$ $cm^{-3}$, may allow for a more positive threshold voltage of the memory cell 200. In some embodiments, after the channel layer 212 is deposited, an annealing process (e.g., at a temperature range of about 300° C. to about 450° C.) in oxygen-related ambient may be performed to activate the charge carriers of the channel layer 212. In some embodiments, the concentration of charge carriers may be controlled by controlling the parameters of the annealing process. For example, in some cases, the concentration can be controlled by controlling the annealing temperature or the annealing atmosphere (e.g., the proportions of ambient $O_2$, $N_2$, or the like).

In FIG. 6, an insulating layer 214 is formed over the channel layer 212, in accordance with some embodiments. The insulating layer 214 may be a material similar to those described previously for the insulating layer 204, and may be formed using similar techniques. The insulating layer 214 may be the same material as or a different material than the material of the underlying insulating layer 204. In some embodiments, a planarization process (e.g., a CMP process) may be performed after forming the insulating layer 214. In other embodiments, the insulating layer 214 may be considered to be an IMD layer, or may be considered to be a dielectric layer of the interconnect structure 120.

Figure 7:
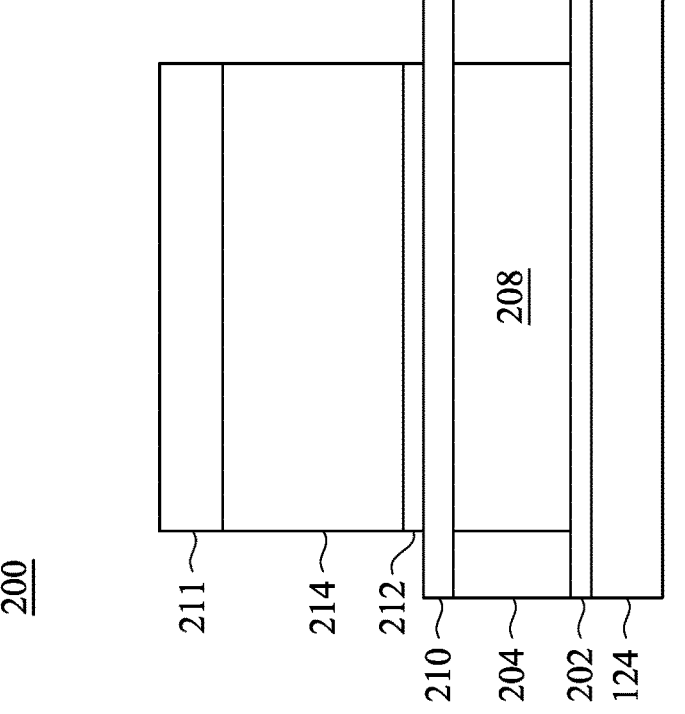

In FIG. 7, the channel layer 212 and the insulating layer 214 are patterned, in accordance with some embodiments. The channel layer 212 and the insulating layer 214 may be patterned using the same patterning steps, in some embodiments. For example, a photoresist 211 may be formed over the insulating layer 214 and then patterned. The photoresist 211 can be formed, for example, using a spin-on technique, and may be patterned using acceptable photolithography techniques. The exposed portions of the insulating layer 214 and underlying portions of the channel layer 212 may then be etched using the patterned photoresist 211 as an etch mask. The etching may be performed using any acceptable etch process, such as a wet etching process, a dry etching process, RIE, NBE, the like, or a combination thereof. The etching may be anisotropic. The insulating layer 214 and the channel layer 212 may be etched using the same etching process or using multiple etching processes. In some embodiments, the etching may stop on the memory layer 210 such that little or none of the memory layer 210 is etched. The photoresist 211 may be subsequently removed using an ashing process or another suitable process.

In other embodiments, the channel layer 212 and the insulating layer 214 may be patterned using separate photolithographic steps. For example, the channel layer 212 may be deposited and patterned before depositing the insulating layer 214, and then the insulating layer 214 may be subsequently deposited and patterned. FIG. 7 shows the sidewalls of the back-gate 208, the channel layer 212, and the insulating layer 214 as having sidewalls that are approximately laterally aligned, but in other embodiments, the back-gate 208, the channel layer 212, and/or the insulating layer 214 may have laterally offset sidewalls. In other words, the back-gate 208, the channel layer 212, and/or the insulating layer 214 may have similar widths or different widths.

Figure 8:
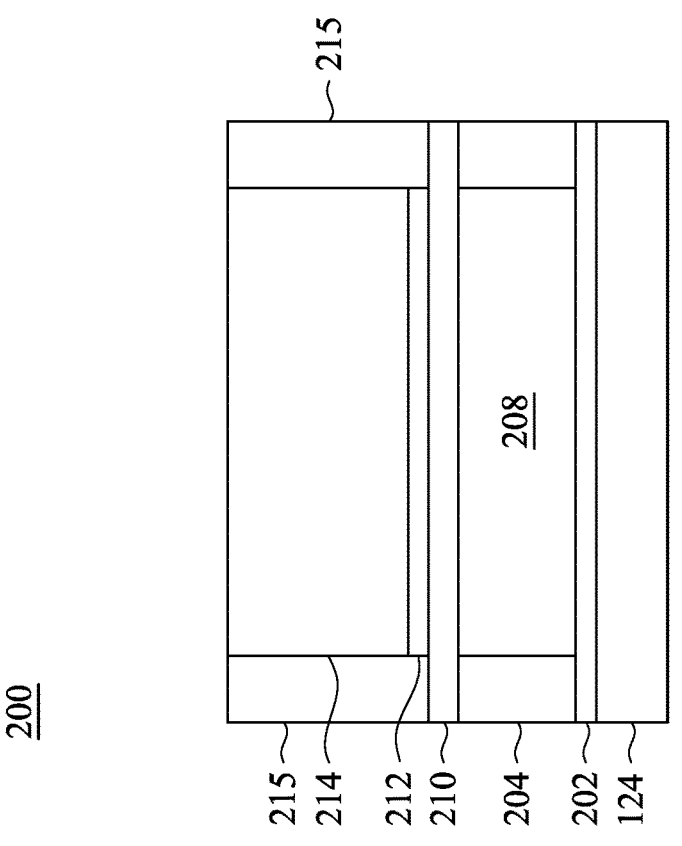

In FIG. 8, an insulating layer 215 is formed over the exposed portions of the memory layer 210, in accordance with some embodiments. The insulating layer 215 may be a material similar to those described previously for the insulating layer 204 or insulating layer 214, and may be formed using similar techniques. In some embodiments, a planarization process (e.g., a CMP process) may be performed to remove excess portions of the insulating layer 215. After performing the planarization process, the insulating layer 215 may cover the insulating layer 214, or the insulating layer 214 may be exposed. In some embodiments, after performing the planarization process, top surfaces of the insulating layer 214 and the insulating layer 215 may be level. In other embodiments, the insulating layer 215 may be considered to be an IMD layer, or may be considered to be a dielectric layer of the interconnect structure 120. In other embodiments, such as embodiments in which the insulating layer 214 is deposited after patterning the channel layer 212, the insulating layer 215 may be omitted.

Figure 9:
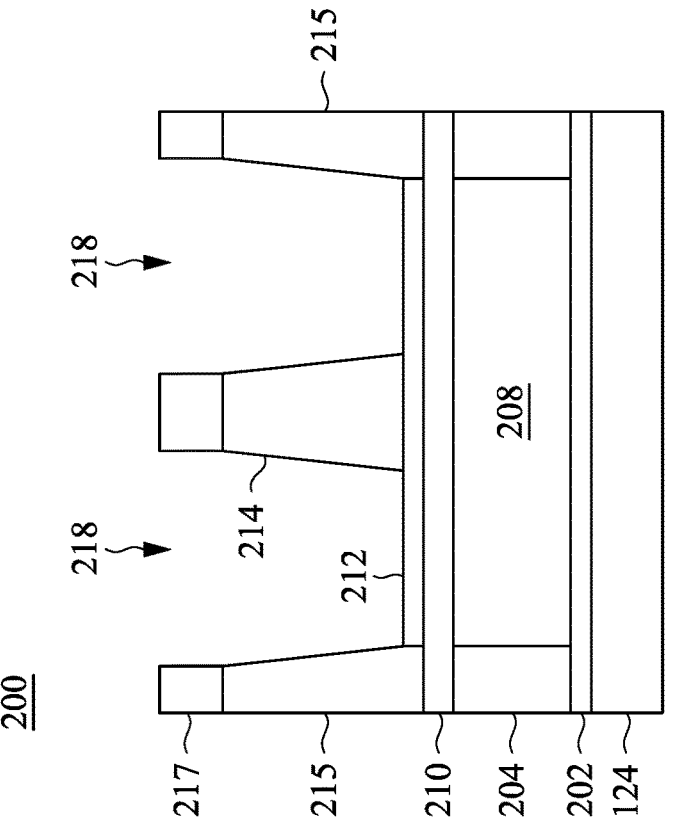

In FIG. 9, openings 218 are formed in the insulating layers 214/215, in accordance with some embodiments. Source/drain structures 230 (see FIG. 13) are subsequently formed in the openings 218. The openings 218 may be formed, for example, by first forming a photoresist 217 over the insulating layers 214/215 and then patterning the photoresist 217. The photoresist 217 can be formed, for example, using a spin-on technique, and may be patterned using acceptable photolithography techniques. The exposed portions of the insulating layers 214/215 may then be etched using the patterned photoresist 217 as an etch mask. The etching may be performed using any acceptable etch process, such as a wet etching process, a dry etching process, RIE, NBE, the like, or a combination thereof. The etching may be anisotropic. The etching exposes the channel layer 212, and may stop on the channel layer 212 in some embodiments. The etching may etch the channel layer 212, in some cases. FIG. 9 illustrates the openings 218 as having tapered sidewalls, but in other embodiments the openings 218 may have vertical sidewalls, curved sidewalls, irregular sidewalls, or sidewalls with other profiles than these examples.

Figure 10:
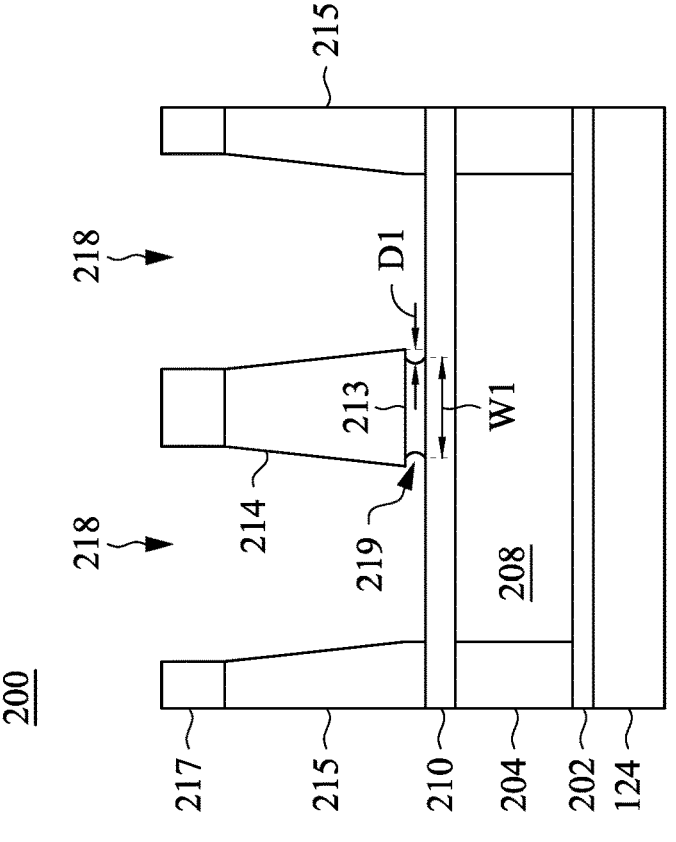

In FIG. 10, the channel layer 212 is etched to form a channel region 213 of the memory cell 200, in accordance with some embodiments. The etching may remove regions of the channel layer 212 within the openings 218 and may expose underlying regions of the memory layer 210, in some embodiments. In other words, the openings 218 may be extended through the channel layer 212 such that top surfaces of the memory layer 210 are exposed within the openings 218 and may form bottom surfaces of the openings 218. The remaining portion of the channel layer 212 underneath the insulating layer 214 forms a channel region 213 that extends between the openings 218. In some embodiments, the channel layer 212 may be etched using a suitable wet etching process or dry etching process, which may be anisotropic. For example, in some embodiments, the etching process may be a RIE process or the like. The etching process may comprise process gases such as $O_2$, $N_2$, $CF_4$, the like, or a combination thereof, in some embodiments. The etching process may comprise a process temperature in the range of about 30° C. to about 150° C., though other temperatures are possible. In some embodiments, the etching process comprises a voltage bias that facilitates anisotropic etching of the channel layer 212. The voltage bias may be in the range of about 100 V to about 800 V, though other voltage biases are possible. Other etching processes, etching parameters, or process gases are possible. In some embodiments, the etching process stops or slows at the memory layer 210. In some embodiments, the etching process is combined with the etching of the openings 218 described for FIG. 9. The photoresist 217 may be removed (e.g., using an ashing process) before etching the channel layer 212, or may be removed after etching the channel layer 212.

In some embodiments, after etching the channel layer 212, the remaining channel region 213 has a width W1 that is in the range of about 20 nm to about 2000 nm, though other widths are possible. The width W1 may be larger, smaller, or approximately the same as a distance between the openings 218. In some embodiments, the etching process etches portions of the channel layer 212 that are underneath the insulating layer 214. In this manner, the channel region 213 may have an "under-cut profile," as shown in FIG. 10, in which the channel region 213 has recessed sidewalls 219 underneath the insulating layer 214. The recessed sidewalls 219 of the channel region 213 may have a concave profile, as shown in FIG. 10, or may have a vertical profile, a convex profile, an irregular profile, or the like. In some embodiments, the recessed sidewalls 219 are recessed a distance D1 that is in the range of about 0 nm to about 10 nm. The recessed sidewalls 219 may be recessed other distances in other embodiments.

Figure 12:
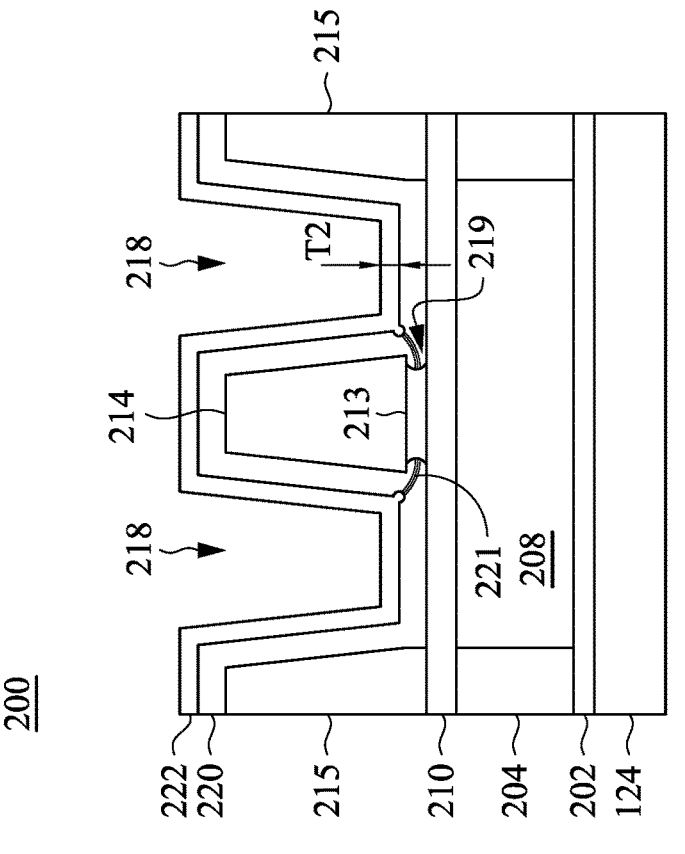
Figure 11:
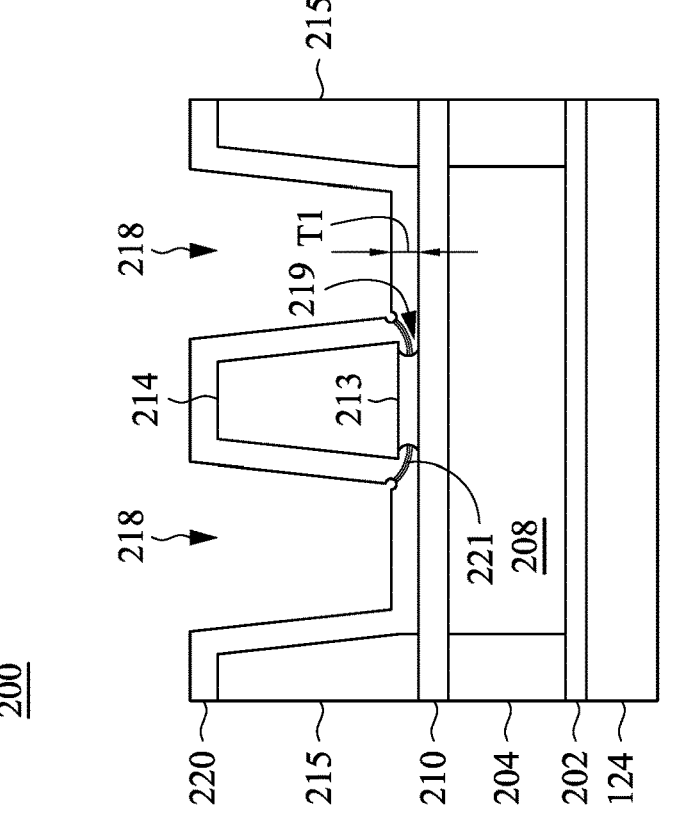
Figures 13, 14:
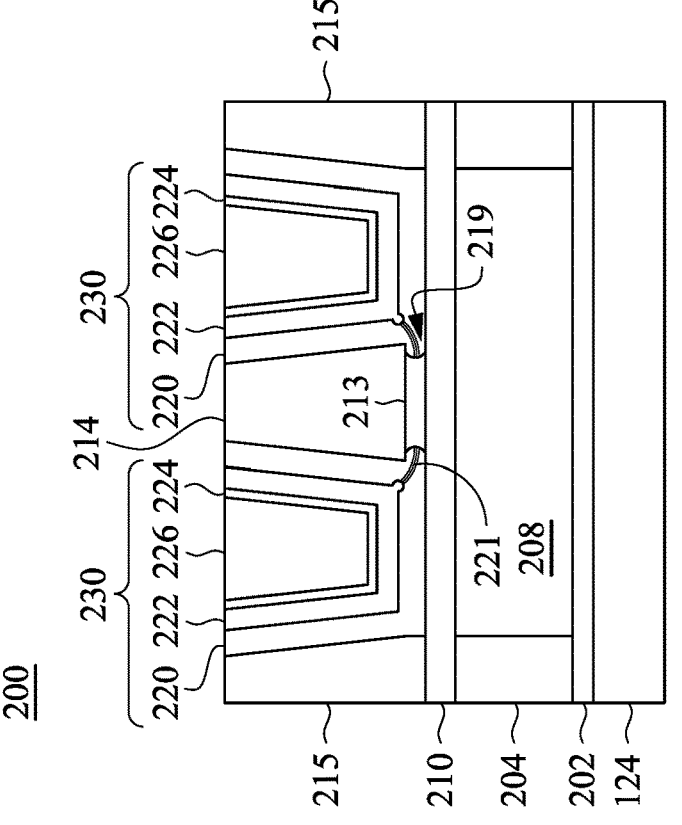
FIGS. 14, 15, 16, and 17 illustrate cross-sectional views of intermediate steps in the formation of a memory cell, in accordance with some embodiments.

FIGS. 11, 12, and 13 illustrate cross-sectional views of intermediate steps in the formation of source/drain structures 230 (see FIG. 13), in accordance with some embodiments. The source/drain structures 230 provide source/drain regions of a TFT of the memory cell 200, in some embodiments. Source/drain region(s) may refer to a source or a drain, individually or collectively dependent upon the context. In some embodiments, each source/drain structure 230 may be part of a bit line or part of a source line of the memory cell 200. In other embodiments, each source/drain structure 230 may be electrically coupled to a bit line or a source line of the memory cell 200.

In FIG. 11, a source/drain layer 220 is deposited in the openings 218, in accordance with some embodiments. The source/drain layer 220 may be deposited conformally on sidewall surfaces and bottom surfaces of the openings 218. For example, the source/drain layer 220 may be deposited on surfaces of the insulating layers 214/215, surfaces of the memory layer 210, and surfaces of the channel region 213 within the openings 218. As shown in FIG. 11, the material of the source/drain layer 220 may be deposited on the recessed sidewalls 219 of the channel region 213. In this manner, the material of the source/drain layer 220 may extend underneath the insulating layer 214 and may partially or completely fill the recesses formed by the recessed sidewalls 219. The source/drain layer 220 may also be deposited on top surfaces of the insulating layers 214/215, in some embodiments. The source/drain layer 220 comprises a material suitable for providing a source/drain region (e.g., a source/drain electrode or source/drain structure) of a Thin-Film Transistor (TFT) of the memory cell 200, in some embodiments. For example, in some embodiments, the source/drain layer 220 comprises a material similar to those described previously for the channel layer 212, such as indium gallium zinc oxide or the like. The source/drain layer 220 may be deposited using a technique similar to those described previously for the channel layer 212, such as PVD, ALD, or the like. Other materials or deposition techniques are possible.

In some embodiments, the material of the source/drain layer 220 is the same as the material of the channel layer 212. In other embodiments, the material of the source/drain layer 220 is a different material than or has a different composition than the material of the channel layer 212. As a non-limiting example, in some embodiments, the source/drain layer 220 and the channel layer 212 are both indium gallium zinc oxide, but with different relative proportions of indium. Other materials or combinations of materials are possible. In some embodiments, the composition of the source/drain layer 220 may be controlled such that the carrier concentration of the source/drain layer 220 is greater than the carrier concentration of the channel layer 212. In some cases, a greater carrier concentration (e.g., "Nd") of the source/drain layer 220 may allow for reduced resistance of the source/drain structures 230, which can improve device speed, performance, and/or efficiency. The carrier concentration of the source/drain layer 220 may be increased, for example, by increasing the relative proportion of indium, though other techniques for controlling carrier concentration are possible. In some embodiments, the concentration of charge carriers (e.g., "Nd") of the source/drain layer 220 may be in the range of about 5e18 $cm^{-3}$ to about 5e19 $cm^{-3}$, though other concentrations are possible. In some embodiments, the source/drain layer 220 may be deposited to a thickness T1 that is in the range of about 2 nm to about 20 nm, though other thicknesses are possible.

In some cases, the presence of the recessed sidewalls 219 of the channel region 213 can result in defects 221 being formed in the source/drain layer 220. For example, defects 221 such as seams, gaps, voids, or the like may form as the source/drain layer 220 is conformally deposited into the recesses formed by the recessed sidewalls 219. In some cases, a defect 221 in the source/drain layer 220 may be located at or near a recessed sidewall 219 of the channel region 213. In some cases, a defect 221 may extend from a recessed sidewall 219 and partway through the source/drain layer 220. In some cases, a defect 221 may extend from a recessed sidewall 219 and fully through the source/drain layer 220. For example, FIG. 11 shows defects 221 extending fully through the source/drain layer 220, from a recessed sidewall 219 to an adjacent corner surface of the source/ drain layer 220. The defects 221 may have various shapes, lengths, or dimensions, which may depend on the geometry of the structure and/or the parameters of the deposition of the source/drain layer 220. For example, the length of the defects 221 may depend on the thickness T1 of the source/drain layer 220. In some cases, defects 221 within the same memory cell 200 may have different shapes, lengths, or dimensions. In some cases, defects 221 are not formed, or may not be formed near all of the recessed sidewalls 219 of a structure.

In some cases, the presence of the defects 221 can result in increased resistance of the source/drain structures 230 (see FIG. 13). For example, regions of the source/drain layer 220 around defects 221 may have increased resistance, or defects 221 may increase the resistance of the interface between the source/drain layer 220 and the channel region 213. Increased resistance of source/drain structure 230 can result in reduced current (e.g., within a TFT of a memory cell), reduced efficiency, reduced device uniformity (e.g., between memory cells of a memory array), or other undesirable effects. In some cases, longer or larger defects 221 can increase resistance and worsen device performance more than shorter or smaller defects 221. Some of the embodiments described in the present disclosure include techniques that can reduce the size of defects 221 and/or reduce undesirable effects caused by the presence of defects 221.

In FIG. 12, a source/drain layer 222 is deposited over the source/drain layer 220, in accordance with some embodiments. The source/drain layer 222 may be deposited conformally on the source/drain layer 220 within the openings 218 and over the insulating layers 214/215, in some embodiments. The source/drain layer 222 comprises a material suitable for providing a source/drain region of a TFT of the memory cell 200, in some embodiments. For example, in some embodiments, the source/drain layer 222 comprises a material similar to those described previously for the channel layer 212, such as indium gallium zinc oxide or the like. The source/drain layer 222 may be deposited using a technique similar to those described previously for the channel layer 212, such as PVD, ALD, or the like. Other materials or deposition techniques are possible.

In some embodiments, the material of the source/drain layer 222 is the same as the material of the source/drain layer 220 and/or the material of the channel layer 212. In other embodiments, the material of the source/drain layer 222 is a different material than or has a different composition than the material of the source/drain layer 220 and/or the material of the channel layer 212. As a non-limiting example, in some embodiments, the source/drain layer 222 and the source/drain layer 220 are both indium gallium zinc oxide. Other materials or combinations of materials are possible. The source/drain layer 222 may be formed having a carrier concentration that is less than, about the same as, or greater than the carrier concentration of the source/drain layer 220. In some embodiments, the source/drain layer 222 may be deposited to a thickness T2 that is in the range of about 2 nm to about 20 nm, though other thicknesses are possible. The thickness T2 of the source/drain layer 222 may be less than, about the same as, or greater than the thickness T1 of the source/drain layer 220.

In some embodiments, by first depositing a source/drain layer 220 on the recessed sidewalls 219, little or no defects are formed during the conformal deposition of the source/drain layer 222. Additionally, in some cases, defects 221 present in the source/drain layer 220 do not propagate into the overlying source/drain layer 222. In this manner, a source/drain layer 222 having little or no defects may provide a less resistive interface with an overlying layer than a source/drain layer 220 having defects 221. In some cases, by covering the defects 221 in the source/drain layer 220 with the source/drain layer 222, overlying conductive material is blocked from penetrating into the defects 221. In some cases, conductive material that penetrates into the defects 221 can cause undesirable effects such as electrical shorts, increased resistance, or reduced device performance. Covering the defects 221 can also reduce variability or inconsistency of devices and device properties due to the variability of the defects 221 within the devices. For example, the techniques described herein can allow for improved uniformity of the TFTs of memory cells (e.g., within a memory array), such as improved uniformity of threshold voltages (e.g., "Vt"), saturation drain current (e.g. "Id"), on-current (e.g., "Ion"), or the like.

In some cases, the techniques described herein can allow for improved device performance, such as increased current (e.g., saturation drain current or the like), increased current difference between programmed states of a memory cell (e.g., "Delta-Ion"), or the like. In some cases, the techniques described herein can increase currents or current differences within a memory cell by as much as about 15%, though greater or smaller increases than this are possible. Thus, depositing a second source/drain layer 222 over a first source/drain layer 220 during formation of a memory cell 200 as described herein can allow for reduced resistance, increased current, improved device performance, improved device reliability, improved yield, improved process control, improved consistency of device characteristics, and/or improved device uniformity. These and other benefits may be provided by any of the embodiments described in the present disclosure, including those described below for FIGS. 14-22.

In FIG. 13, a liner layer 224 and a source/drain metal 226 are deposited over the source/drain layer 222 to form source/drain structures 230, in accordance with some embodiments. The liner layer 224 is an optional layer that may be, for example, a diffusion barrier layer, an adhesion layer, or the like. The liner layer 224 and the source/drain metal 226 comprise one or more conductive materials suitable for providing source/drain regions of a TFT of the memory cell 200, in some embodiments. For example, the liner layer 224 and the source/drain metal 226 may comprise one or more materials that form a suitably conductive contact with the source/drain layer 222. The liner layer 224 (if present) is deposited on the source/drain layer 222, and may comprise a material such as titanium, titanium nitride, tantalum, tantalum nitride, the like, or a combination thereof. The source/drain metal 226 is deposited on the liner layer 224 and may comprise one or more materials such as copper, copper alloy, silver, gold, tungsten, nickel, cobalt, ruthenium, aluminum, molybdenum, the like, or a combination thereof. The source/drain metal 226 may be deposited to fill the openings 218, in some embodiments. The liner layer 224 and the source/drain metal 226 may be deposited using a suitable technique, such as CVD, ALD, PVD, PECVD, the like, or a combination thereof. Other materials or deposition techniques are possible.

By covering the defects 221 with the source/drain layer 222, the interface between the source/drain layers 220/222 and the source/drain metal 226 may be improved. Additionally, the source/drain layer 222 may block material of the liner layer 224 and/or the source/drain metal 226 from penetrating into the defects 221. In this manner, depositing the source/drain layer 222 over the source/drain layer 220 as described herein can improve resistance, reliability, and uniformity of the source/drain structures 230. In other embodiments, one or more additional source/drain layers (not shown) may be deposited on the source/drain layer 222. These additional source/drain layers may be materials similar to those described previously for the source/drain layers 220/222, and may be deposited using similar techniques.

In some embodiments, a planarization process (e.g., a CMP process and/or a grinding process) may be performed to remove excess material from upper surfaces of the insulating layers 214/215. For example, the planarization process may remove excess material of the source/drain layer 220, the source/drain layer 222, the liner layer 224, and/or the source/drain metal 226. After performing the planarization process, top surfaces of the insulating layer 214, the insulating layer 215, the source/drain layer 220, the source/drain layer 222, the liner layer 224, and/or the source/drain metal 226 may be level (e.g., coplanar within process variations). In this manner, a memory cell 200 is formed, in accordance with some embodiments. As described previously, the memory cell 200 may be part of a larger memory array, in some embodiments. Those skilled in the art should appreciate that further processing may be performed on the structure shown in FIG. 13, such as the formation of overlying features or structures.

Figure 16:
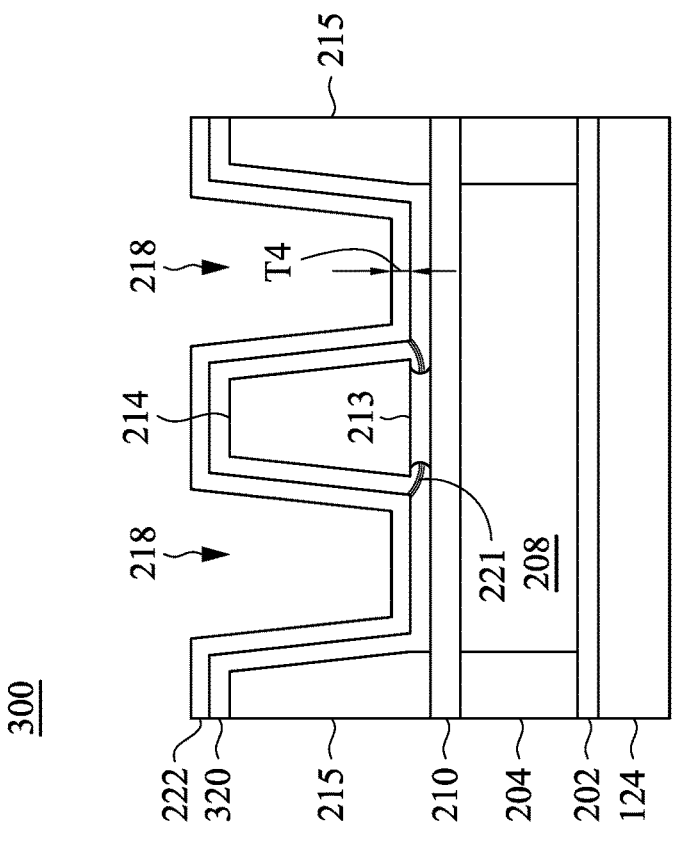
Figure 17:
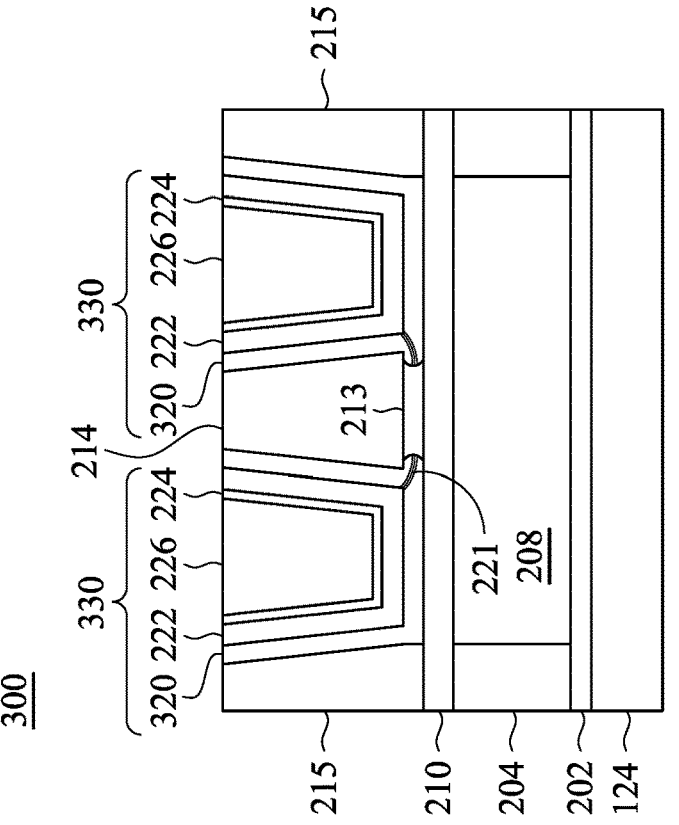

FIGS. 14 through 17 illustrate intermediate steps in the formation of a memory cell 300 (see FIG. 17), in accordance with some embodiments. The memory cell 300 of FIG. 17 is similar to the memory cell 200 of FIG. 13, except that the source/drain layer 220 of the memory cell 300 is thinned prior to depositing the source/drain layer 222. Many of the materials and/or techniques used for forming the memory cell 300 may be similar to those described previously for the memory cell 200, and thus some details may not be repeated.

FIG. 14 illustrates a cross-sectional view of an intermediate step in the formation of a memory cell 300, after deposition of the source/drain layer 220, in accordance with some embodiments. The structure shown in FIG. 14 is similar to the structure shown in FIG. 11, and may be formed using similar materials and/or techniques. The source/drain layer 220 may be similar to the source/drain layer 220 described previously for FIG. 11, and may be formed using similar techniques. For example, defects 221 may be present in the source/drain layer 220 near the recessed sidewalls 219 of the channel region 213, in some cases. In some embodiments, the source/drain layer 220 may be deposited to a thickness T1 that is in the range of about 2 nm to about 20 nm, though other thicknesses are possible.

Figure 15:
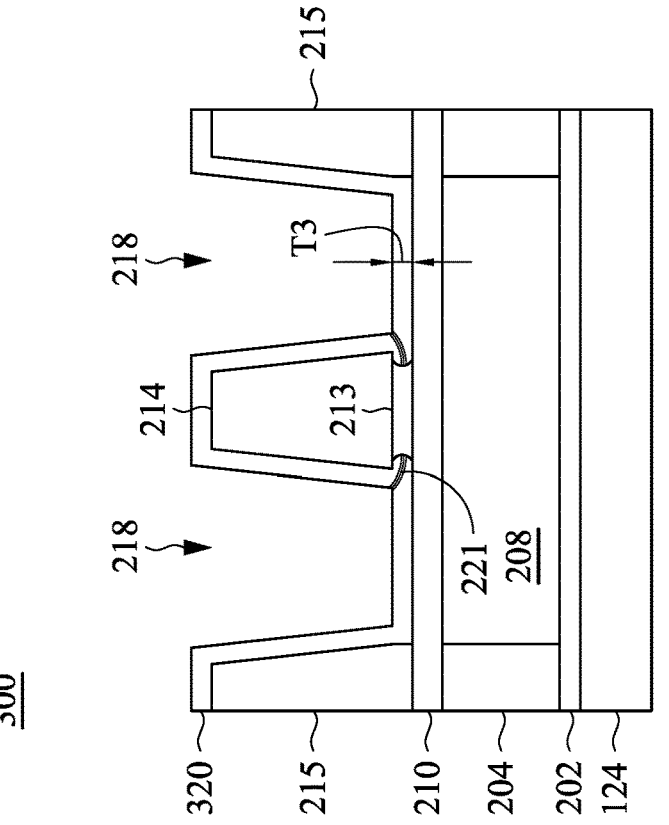

In FIG. 15, an etching process is performed to thin the source/drain layer 220, in accordance with some embodiments. After being thinned, the source/drain layer 220 is referred to herein and indicated in the Figures as "the thinned source/drain layer 320." The source/drain layer 220 may be thinned, for example, using an acceptable etching process. The etching process may include any acceptable etching process, which may include a wet etching process and/or a dry etching process (e.g., a plasma etching process, RIE, NBE, or the like). The etching process may be isotropic, in some embodiments. For example, in some embodiments, the etching process may include an RIE with no voltage bias. In some embodiments, the etching process may comprise process gases such as $NF_3$, $NH_3$, or the like. Other etching processes, etching parameters, or etchants are possible.

In some embodiments, the thinned source/drain layer 320 has a thickness T3 that is between about 10% and about 50% of the thickness T1 of the source/drain layer 220. The thinned source/drain layer 320 may have a thickness in the range of about 1 nm to about 10 nm, in some embodiments. Other thicknesses or relative thicknesses are possible. In some cases, thinning the source/drain layer 220 removes portions of the defects 221. In some embodiments, a length of a defect 221 in the thinned source/drain layer 320 may be between about 10% and about 60% of its length in the source/drain layer 220 prior to thinning. Other relative lengths are possible. In some cases, removing portions of the defects 221 by thinning the source/drain layer 220 as described herein can reduce a resistance of the subsequently formed source/drain structures 330 (see FIG. 17).

In FIG. 16, a source/drain layer 222 is deposited over the thinned source/drain layer 320, in accordance with some embodiments. The source/drain layer 222 may be similar to the source/drain layer 222 described previously for FIG. 12, and may be formed using similar techniques. For example, the source/drain layer 222 may be deposited conformally on the thinned source/drain layer 320 within the openings 218 and over the insulating layers 214/215, in some embodiments. In some embodiments, the material of the source/drain layer 222 is the same as the material of the thinned source/drain layer 320 and/or the material of the channel layer 212. In other embodiments, the material of the source/drain layer 222 is a different material than or has a different composition than the material of the thinned source/drain layer 320 and/or the material of the channel layer 212. As a non-limiting example, in some embodiments, the source/drain layer 222 and the thinned source/drain layer 320 are both indium gallium zinc oxide. Other materials or combinations of materials are possible. The source/drain layer 222 may be formed having a carrier concentration that is less than, about the same as, or greater than the carrier concentration of the thinned source/drain layer 320. In some embodiments, the source/drain layer 222 may be deposited to a thickness T4 that is in the range of about 2 nm to about 20 nm, though other thicknesses are possible. The thickness T4 of the source/drain layer 222 may be less than, about the same as, or greater than the thickness T3 of the thinned source/drain layer 320. For example, FIG. 17 shows an embodiment in which the thickness T4 of the source/drain layer 222 is greater than the thickness T3 of the thinned source/drain layer 320.

In FIG. 17, a liner layer 224 and a source/drain metal 226 are deposited to form source/drain structures 330, in accordance with some embodiments. The liner layer 224 may be similar to the liner layer 224 described previously for FIG. 13, and the source/drain metal 226 may be similar to the source/drain metal 226 described previously for FIG. 13. The liner layer 224 and the source/drain metal 226 may be deposited using a suitable process, such as those described previously for FIG. 13. In some embodiments, a planarization process is performed to remove excess material of the source/drain layer 220, the source/drain layer 222, the liner layer 224, and/or the source/drain metal 226. In this manner, the source/drain structures 330 may be similar to the source/drain structures 230 described previously for FIG. 13, though other source/drain structures are possible.

Figures 21, 22:
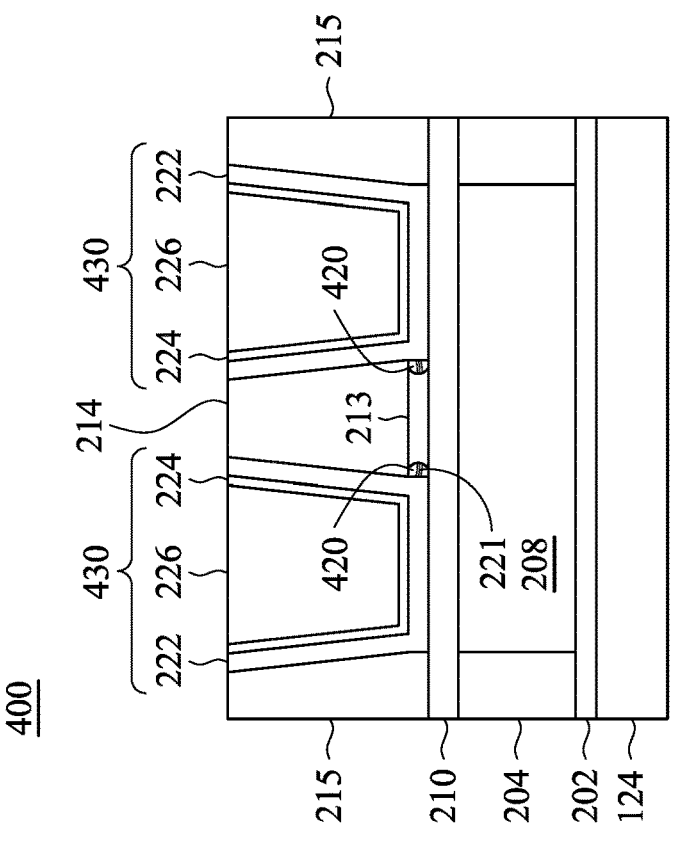
FIG. 22 illustrates a cross-sectional view of a memory cell, in accordance with some embodiments.

FIGS. 18 through 21 illustrate intermediate steps in the formation of a memory cell 400 (see FIG. 21), in accordance with some embodiments. The memory cell 400 of FIG. 21 is similar to the memory cell 300 of FIG. 17, except that, prior to depositing the source/drain layer 222, the source/drain layer 220 of the memory cell 400 is etched until the memory layer 210 is exposed. Many of the materials and/or techniques used for forming the memory cell 400 may be similar to those described previously for the memory cells 200/300, and thus some details may not be repeated.

Figure 18:
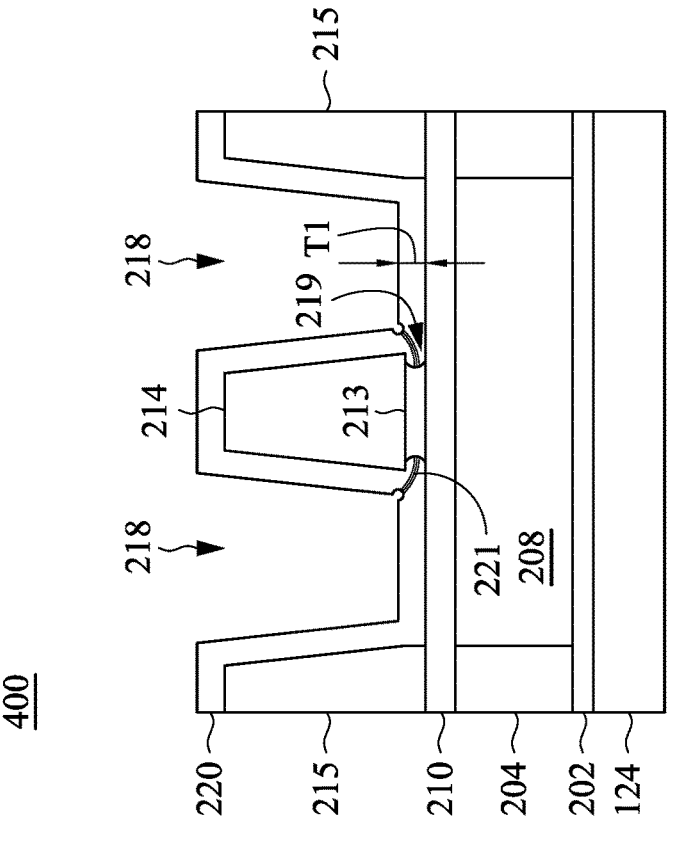
FIGS. 18, 19, 20, and 21 illustrate cross-sectional views of intermediate steps in the formation of a memory cell, in accordance with some embodiments.

FIG. 18 illustrates a cross-sectional view of an intermediate step in the formation of a memory cell 400, after deposition of the source/drain layer 220, in accordance with some embodiments. The structure shown in FIG. 18 is similar to the structure shown in FIG. 11, and may be formed using similar materials and/or techniques. The source/drain layer 220 may be similar to the source/drain layer 220 described previously for FIG. 11, and may be formed using similar techniques. For example, defects 221 may be present in the source/drain layer 220 near the recessed sidewalls 219 of the channel region 213, in some cases.

Figure 19:
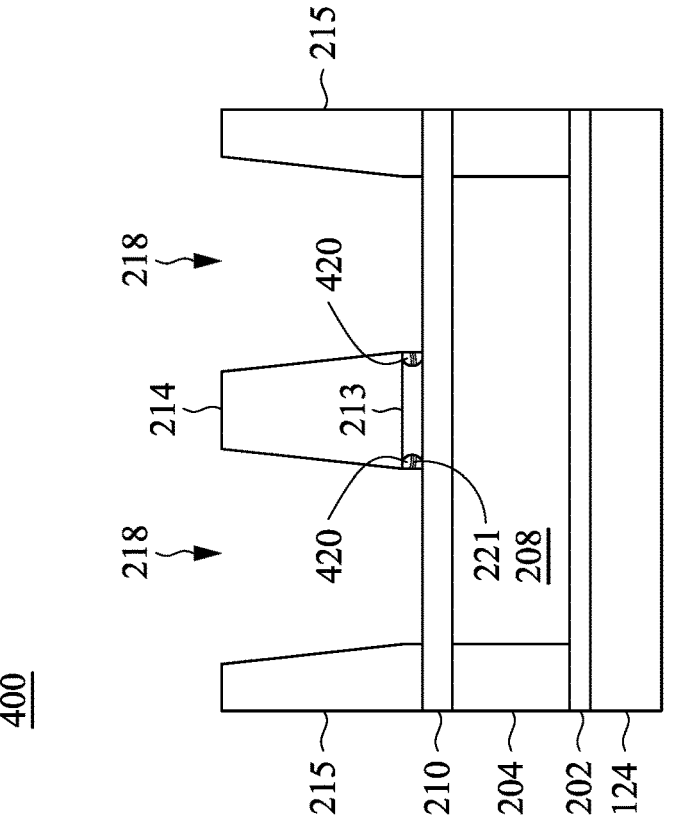

In FIG. 19, an etching process is performed on the source/drain layer 220, in accordance with some embodiments. The etching process removes material of the source/drain layer 220 to expose the memory layer 210 within the openings 218, in some embodiments. The etching process may also expose the insulating layers 214/215 within the openings 218 and/or outside of the openings 218, in some embodiments. As shown in FIG. 19, after performing the etching process, portions 420 of the source/drain layer 220 may remain on the recessed sidewalls 219 of the channel region 213. The source/drain portions 420 may fill or partially fill the recesses formed by the recessed sidewalls 219 underneath the insulating layer 214. The exposed sidewalls of the source/drain portions 420 may have a substantially vertical profile, an oblique profile, a straight profile, a concave profile, a convex profile, an irregular profile, or another profile shape than these examples. In some embodiments, the exposed sidewalls of the source/drain portions 420 may be approximately aligned with the lower sidewalls of the insulating layer 214. In other embodiments, the exposed sidewalls of the source/drain portions 420 may be laterally offset from the lower sidewalls of the insulating layer 214. In other words, the source/drain portions 420 may laterally protrude out of the recesses formed by the recessed sidewalls 219 underneath the insulating layer 214, or the source/drain portions 420 may be contained within the recesses formed by the recessed sidewalls 219 underneath the insulating layer 214. A source/drain portion 420 may or may not have a defect 221 within, which may depend on the particulars of the etching and/or the structure, in some cases. In some cases, removing portions of the defects 221 by etching the source/drain layer 220 as described herein can reduce a resistance of the subsequently formed source/drain structures 430 (see FIG. 21).

The etching process may include any acceptable etching process, which may be similar to the etching process described previously for FIG. 15. For example, the etching process may include a dry etching process (e.g., a plasma etching process, RIE, NBE, or the like). The etching process may be isotropic, in some embodiments. For example, in some embodiments, the etching process may include an RIE with no voltage bias. Other etching processes are possible. In some embodiments, the etching process may stop or slow on surfaces of the memory layer 210 and/or the insulating layers 214/215.

Figure 20:
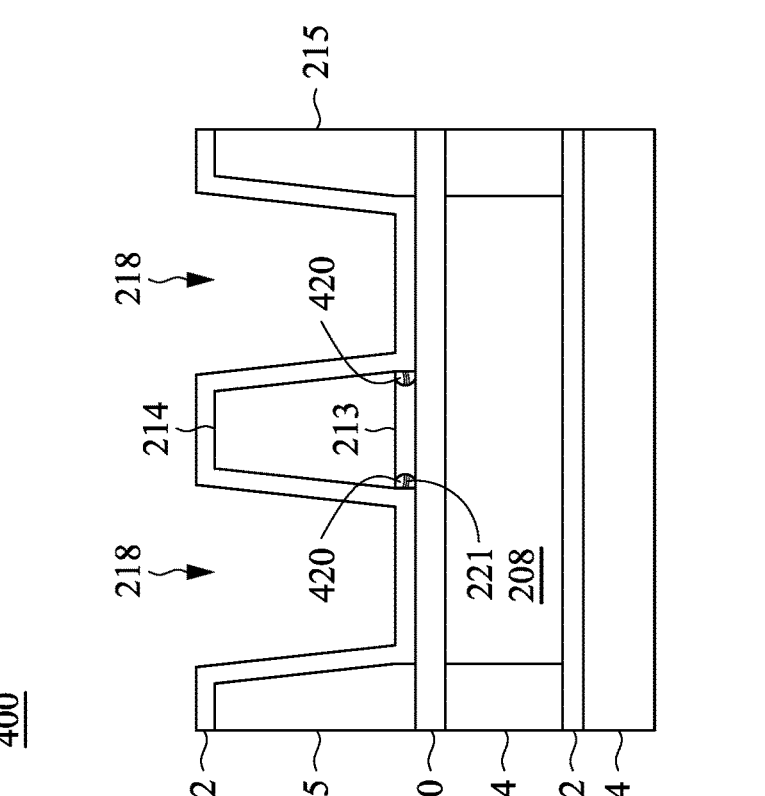

In FIG. 20, a source/drain layer 222 is deposited over the insulating layers 214/215, the memory layer 210, and the source/drain portions 420, in accordance with some embodiments. The source/drain layer 222 may be similar to the source/drain layer 222 described previously for FIG. 12, and may be formed using similar techniques. The source/drain layer 222 may be deposited conformally on sidewall surfaces and bottom surfaces of the openings 218. For example, the source/drain layer 222 may be deposited on surfaces of the insulating layers 214/215, surfaces of the memory layer 210, and surfaces of the source/drain portions 420. The source/drain layer 220 may also be deposited on top surfaces of the insulating layers 214/215, in some embodiments. In some cases, the presence of the source/drain portions 420 within the recesses formed by the recessed sidewalls 219 underneath the insulating layer 214 can reduce the chance of defects (e.g. similar to defects 221) being formed near the channel region 213 during deposition of the source/drain layer 222. In this manner, depositing and then etching a source/drain layer 220 before depositing the source/drain layer 222 can reduce a resistance of the subsequently formed source/drain structures 430 (see FIG. 21).

The material of the source/drain layer 222 may be the same as or different than the material of the source/drain portions 420 and/or the material of the channel region 213. The source/drain layer 222 may be formed having a carrier concentration that is less than, about the same as, or greater than the carrier concentration of the source/drain portions 420. In some cases, forming source/drain portions 420 having a relatively high carrier concentration may improve the electrical contact between the subsequently formed source/drain structures 430 (see FIG. 21) and the channel region 213. In some embodiments, the source/drain layer 222 may be deposited to a thickness that is in the range of about 2 nm to about 20 nm, though other thicknesses are possible.

In FIG. 21, a liner layer 224 and a source/drain metal 226 are deposited to form source/drain structures 430, in accordance with some embodiments. The liner layer 224 may be similar to the liner layer 224 described previously for FIG. 13, and the source/drain metal 226 may be similar to the source/drain metal 226 described previously for FIG. 13. The liner layer 224 and the source/drain metal 226 may be deposited using a suitable process, such as those described previously for FIG. 13. In some embodiments, a planarization process is performed to remove excess material of the source/drain layer 220, the source/drain layer 222, the liner layer 224, and/or the source/drain metal 226. In this manner, the source/drain structures 430 may be similar to the source/drain structures 230 described previously for FIG. 13, though other source/drain structures are possible.

FIG. 22 illustrates a cross-sectional view of a memory cell 500, in accordance with some embodiments. The memory cell 500 of FIG. 22 is similar to the memory cell 300 of FIG. 17, except that the back-gate 208 and the source/drain structures 330 are shown as being physically and electrically connected to conductive features 122A-C. The embodiment of FIG. 22 is an example, and any embodiment memory cells as described herein may be connected to conductive feature 122A-C in a similar or a different configuration. One or more of the conductive features 122A-C shown in FIG. 22 may be conductive features of an interconnect structure, such as conductive features 122 of the interconnect structure 120 described previously for FIG. 1. The conductive features 122A-C may be similar to the conductive features 122 described previously, and may be formed using similar techniques, in some embodiments. In some embodiments, the conductive features 122A-C are electrically coupled to other memory cells to form a memory array. For example, in some embodiments, the conductive feature 122A may be a word line, the conductive feature 122B may be a bit line, and the conductive feature 122C may be a source line. Other configurations are possible.

As an illustrative example, to write to a memory cell such as the memory cell 500, a write voltage is applied across the memory layer 210 of the memory cell by applying appropriate voltages to the word line (e.g., 122A), the bit line (e.g., 122B), and the source line (e.g., 122C). By applying the write voltage across the memory layer 210, a polarization direction of the memory cell's memory layer 210 can be changed. As a result, the threshold voltage of the memory cell's TFT can be switched from a low threshold voltage to a high threshold voltage or vice versa, and thus a binary value can be stored in the memory cell. In some embodiments, the word lines of a memory array may intersect the bit lines and source lines, which allows individual cells to be selected for write operations.

To read the value stored in the memory cell, a read voltage may be applied to the word line (e.g., 122A). The read voltage may be, for example, a voltage between the low threshold voltage and the high threshold voltage of the memory cell's TFT. Depending on the polarization direction of the memory cell's memory layer 210, the memory cell's TFT may or may not be turned on. For example, when the TFT is in the low threshold voltage state, the TFT's channel region 213 conducts current when the read voltage is applied, and when the TFT is in the high threshold voltage state, the TFT's channel region 213 conducts little or no current when the read voltage is applied. As a result, a read current may or may not be present when a voltage is applied between the bit line (e.g., 122B) and the source line (e.g., 122C). In this manner, the binary value stored in the memory cell can be determined.

The embodiments described herein allow for the formation of Ferroelectric Thin-Film Transistor (FeTFT) memory cells with improved performance and more uniform performance. By depositing a second source/drain layer over a first source/drain layer, and the defects in the first source/drain layer, the subsequently-deposited conductive material contacts the relatively defect-free second source/drain layer. Due to the presence of defects in the first source/drain layer, the second source/drain layer provides a less resistive interface than the first source/drain layer. In some cases, etching the first source/drain layer before depositing the second source/drain layer can reduce the size of defects in the first source/drain layer, which can decrease resistance, reduce the risk of defect-related problems, increase yield, and improve device uniformity. The techniques described herein can increase the current within a memory cell, which can improve device performance, efficiency, and speed. Reducing defect size as described herein can also reduce the effect of defects on memory cell performance, which can improve process control and consistency between multiple memory cells, such as the memory cells of a memory array.

In accordance with some embodiments of the present disclosure, a method includes forming a first conductive feature in a first dielectric layer; depositing a memory layer on the first conductive feature; depositing a channel layer on the memory layer; depositing a second dielectric layer on the channel layer; etching a first opening and a second opening in the second dielectric layer to expose the channel layer; etching the channel layer exposed by the first opening and the second opening to expose the memory layer, wherein a remaining region of the channel layer extends between the first opening and the second opening; depositing a first source/drain layer in the first opening and the second opening, wherein the first source/drain layer physically contacts the remaining region; depositing a second source/drain layer on the first source/drain layer in the first opening and the second opening; and depositing a conductive material on the second source/drain layer in the first opening and the second opening. In an embodiment, the method includes etching the first source/drain layer prior to depositing the second source/ drain layer. In an embodiment, etching the first source/drain layer exposes the memory layer. In an embodiment, depositing the first source/drain layer forms a defect in the first source/drain layer near the remaining region. In an embodiment, the second source/drain layer is free of defects. In an embodiment, etching the channel layer forms recesses underneath the second dielectric layer. In an embodiment, the second source/drain layer has a different doping concentration than the first source/drain layer. In an embodiment, the first source/drain layer and the second source/drain layer are the same material.

In accordance with some embodiments of the present disclosure, a method includes forming a word line over a substrate; forming a ferroelectric layer over the word line; forming a channel region over the ferroelectric layer; and forming a bit line and a source line on opposite sidewalls of the channel region, wherein forming the bit line and the source line includes depositing a first oxide semiconductor layer on the ferroelectric layer and on the opposite sidewalls of the channel region; etching the first oxide semiconductor layer, wherein portions of the first oxide semiconductor layer remain on the opposite sidewalls of the channel region after the etching; depositing a second oxide semiconductor layer over the ferroelectric layer and the remaining portions of the first oxide semiconductor layer; and depositing a conductive material over the second oxide semiconductor layer. In an embodiment, depositing the first oxide semiconductor layer includes a conformal deposition process. In an embodiment, the first oxide semiconductor layer includes indium gallium zinc oxide. In an embodiment, the first oxide semiconductor layer includes a defect extending from a sidewall of the channel region to a top surface of the first oxide semiconductor layer. In an embodiment, etching the first oxide semiconductor layer exposes the ferroelectric layer. In an embodiment, the method includes depositing an insulating layer over the channel region, wherein the remaining portions of the first oxide semiconductor layer protrude underneath the insulating layer. In an embodiment, the opposite sidewalls of the channel region are curved.

In accordance with some embodiments of the present disclosure, a device includes a memory layer over a substrate; a first source/drain structure and a second source/drain structure on the memory layer, wherein the first source/drain structure and the second source drain structure each include a first source/drain layer on the memory layer; a second source/drain layer on the first source/drain layer, wherein the second source/drain layer is different from the first source/drain layer; and a metal layer on the second source/drain layer; and a channel region extending on the memory layer from the first source/drain layer of the first source/drain structure to the first source/drain layer of the second source/drain structure. In an embodiment, the second source/drain layer has a thickness in the range of 2 nm to 20 nm. In an embodiment, the second source/drain layer is thicker than the first source/drain layer. In an embodiment, the first source/drain layer includes a seam. In an embodiment, the second source/drain layer is free of seams.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first conductive feature in a first dielectric layer;
depositing a memory layer on the first conductive feature;
depositing a channel layer on the memory layer;
depositing a second dielectric layer on the channel layer;
etching a first opening and a second opening in the second dielectric layer to expose the channel layer;
etching the channel layer exposed by the first opening and the second opening to expose the memory layer, wherein a remaining region of the channel layer extends between the first opening and the second opening;
depositing a first source/drain layer in the first opening and the second opening, wherein the first source/drain layer physically contacts the remaining region;
depositing a second source/drain layer on the first source/drain layer in the first opening and the second opening; and
depositing a conductive material on the second source/drain layer in the first opening and the second opening.

2. The method of claim 1 further comprising etching the first source/drain layer prior to depositing the second source/drain layer.

3. The method of claim 2, wherein etching the first source/drain layer exposes the memory layer.

4. The method of claim 1, wherein depositing the first source/drain layer forms a defect in the first source/drain layer near the remaining region.

5. The method of claim 1, wherein the second source/drain layer is free of defects.

6. The method of claim 1, wherein etching the channel layer forms recesses underneath the second dielectric layer.

7. The method of claim 1, wherein the second source/drain layer has a different doping concentration than the first source/drain layer.

8. The method of claim 1, wherein the first source/drain layer and the second source/drain layer comprise the same material.

9. A method comprising:
forming a word line over a substrate;
forming a ferroelectric layer over the word line;
forming a channel region over the ferroelectric layer; and
forming a bit line and a source line on opposite sidewalls of the channel region, wherein forming the bit line and the source line comprises:
depositing a first oxide semiconductor layer on the ferroelectric layer and on the opposite sidewalls of the channel region;

etching the first oxide semiconductor layer, wherein portions of the first oxide semiconductor layer remain on the opposite sidewalls of the channel region after the etching;
depositing a second oxide semiconductor layer over the ferroelectric layer and the remaining portions of the first oxide semiconductor layer; and
depositing a conductive material over the second oxide semiconductor layer.

10. The method of claim 9, wherein depositing the first oxide semiconductor layer comprises a conformal deposition process.

11. The method of claim 9, wherein the first oxide semiconductor layer comprises indium gallium zinc oxide.

12. The method of claim 9, wherein the first oxide semiconductor layer comprises a defect extending from a sidewall of the channel region to a top surface of the first oxide semiconductor layer.

13. The method of claim 9, wherein etching the first oxide semiconductor layer exposes the ferroelectric layer.

14. The method of claim 9 further comprising depositing an insulating layer over the channel region, wherein the remaining portions of the first oxide semiconductor layer protrude underneath the insulating layer.

15. The method of claim 9, wherein the opposite sidewalls of the channel region are curved.

16. A method comprising:
forming a memory layer over a substrate;
forming a channel region on the memory layer; and
forming a first source/drain structure and a second source/drain structure on the memory layer, wherein forming the first source/drain structure and the second source drain structure each comprise:
forming a first source/drain layer on the memory layer, wherein the
channel region extends on the memory layer from the first source/drain layer of the first source/drain structure to the first source/drain layer of the second source/drain structure;
forming a second source/drain layer on the first source/drain layer, wherein the second source/drain layer is different from the first source/drain layer; and
forming a metal layer on the second source/drain layer
wherein at least one of the first source/drain layer or second source/drain layer is an oxide semiconductor material.

17. The method of claim 16, wherein the second source/drain layer has a thickness in the range of 2 nm to 20 nm.

18. The method of claim 16 wherein the second source/drain layer is thicker than the first source/drain layer.

19. The method of claim 16, wherein the memory layer comprises an oxide material comprising hafnium.

20. The method of claim 1, wherein the memory layer is a ferroelectric layer.

* * * * *